(12) United States Patent
Ozaki

(10) Patent No.: US 6,249,964 B1
(45) Date of Patent: *Jun. 26, 2001

(54) METHOD FOR MANUFACTURING A PRINTED CIRCUIT BOARD

(75) Inventor: Yosuke Ozaki, Kokubunji (JP)

(73) Assignee: O.K. Print Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/936,017

(22) Filed: Sep. 23, 1997

(30) Foreign Application Priority Data

Sep. 30, 1996 (JP) .................................... 8-258260

(51) Int. Cl.[7] .................................................. H01K 3/10
(52) U.S. Cl. ................................ 29/852; 29/846; 29/832; 29/825
(58) Field of Search .................................. 29/830, 831–2, 29/846, 852; 174/252, 266; 427/97

(56) References Cited

U.S. PATENT DOCUMENTS 5,093,761    3/1992    Ozaki .

*Primary Examiner*—Lee Young
*Assistant Examiner*—Sean Smith
(74) *Attorney, Agent, or Firm*—Birch, Stewart, Kolasch & Birch, LLP

(57) ABSTRACT

The present invention relates to a method for manufacturing a printed circuit board The method for manufacturing a printed circuit board of the present invention comprises opening resin holes in a copper plate, filling second resins such as epoxy resins in the resin holes, attaching first metal foils such as copper foils through first resins such as polyimide resins dissolved in solvents on the copper plate, selectively etching the first metal foils, attaching second metal foils through the first resins dissolved in a solvent on both the faces, selectively wet-etching the second metal foils, irradiating laser beam over the resulting thereby exposed first resins to open a connection holes in the second metal foils and resin layers consisting of the first resin, electroless copper plating and subsequent electrolytic copper plating to form copper-plated layers on both the faces, and thereafter selectively etching the second metal foils and the copper-plated layers.

22 Claims, 5 Drawing Sheets

METHOD FOR MANUFACTURING A PRINTED CIRCUIT BOARD

BACKGROUND OF THE INVENTION

1. Field of the Invention

The present invention relates to a method for manufacturing a printed circuit board.

2. Description of the Background Art

Conventional methods for manufacturing a printed circuit board comprise opening holes in a copper plate, filling epoxy resins in the holes, additionally forming circuit layers on both the faces of two first resin plates, further forming circuit layers on one face of the two second resin plates and simultaneously attaching copper foils on the other face thereof, bonding the first resin plates on both the faces of the copper plate by means of prepreg, further bonding the second resin plates on both the faces thereof by means of prepreg, opening through the copper plate, the first resin plates and the second resin plates through-hole openings with the center line approximately lying on the center line of the holes, forming a copper-plated layer by electroless copper plating and subsequent electrolytic copper plating, and selectively etching the copper-plated layer and the copper foils, thereby providing through holes.

According to such methods for manufacturing a printed circuit board, an interface is present between the first and second resin plates as the insulating layers and the prepreg, and therefore, the resulting printed circuit board may eventually be warped.

SUMMARY OF THE INVENTION

It is an object of the present invention to provide a method for manufacturing a printed circuit board, with no occurrence of any warpage of the printed circuit board.

According to the present invention, a method for manufacturing a printed circuit board is provided, comprising attaching first metal foils through first resins dissolved in solvents on both the faces of a metal plate, selectively etching the first metal foils, attaching second metal foils through the first resins dissolved in the solvents on both the faces, opening connection holes in the second metal foils and resin layers consisting of the first resins, forming plated layers on both the faces, and selectively etching the second metal foils and the plated layers.

By the method for manufacturing a printed circuit board, no interface is present in the resin layer as the insulating layer, and therefore, no warpage occurs in the printed circuit board.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE INVENTION

Figure 1A:
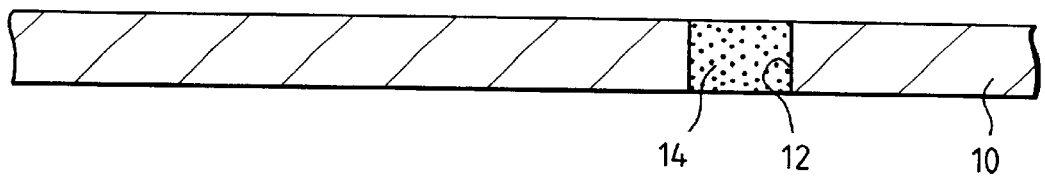
FIGS. 1a–1d, 2a–2c, FIGS. 3a–3b, FIGS. 4a–4b, and FIG. 5 are explanatory views showing a step-by-step method for manufacturing a printed circuit board in accordance with the present invention.
Figure 1B:
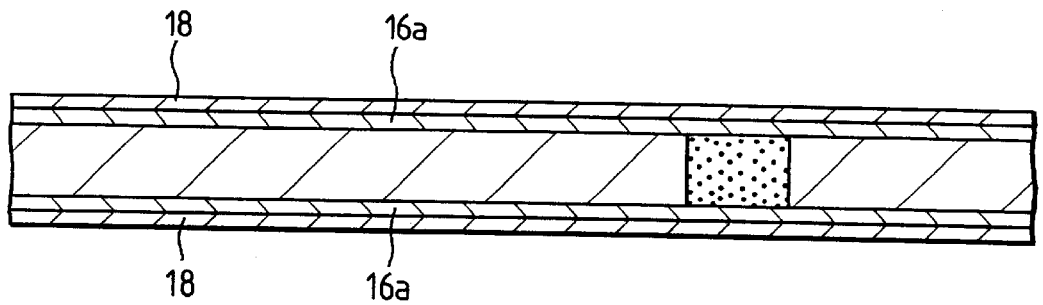
Figure 1C:
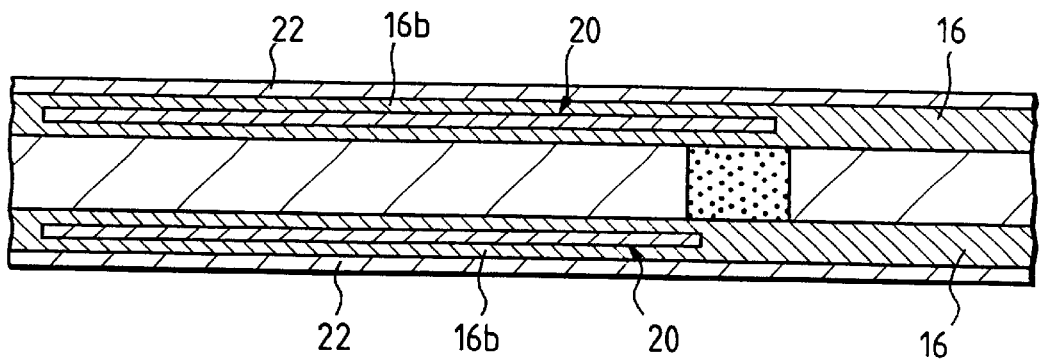
Figure 1D:
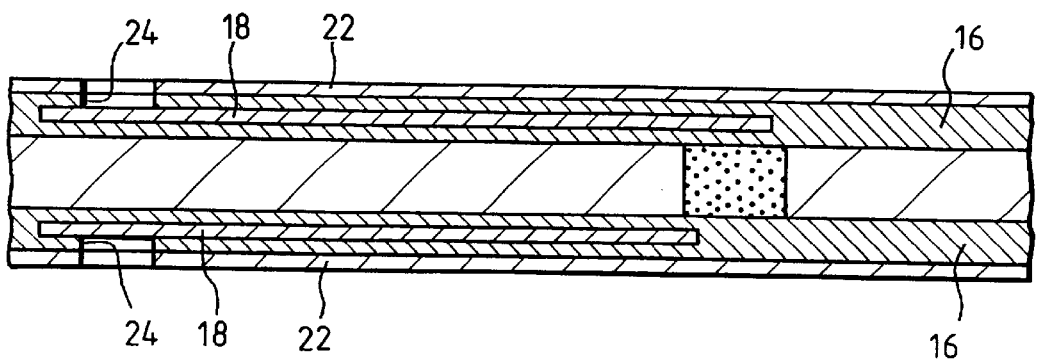
Figure 2A:
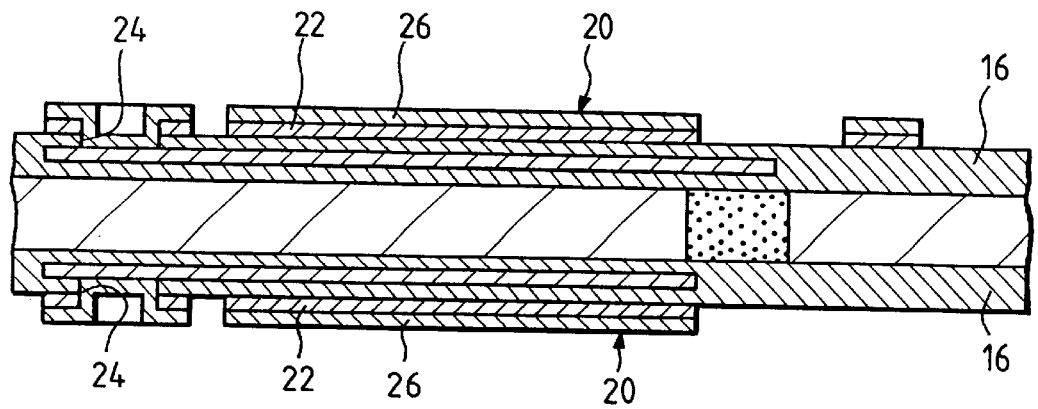
Figure 2B:
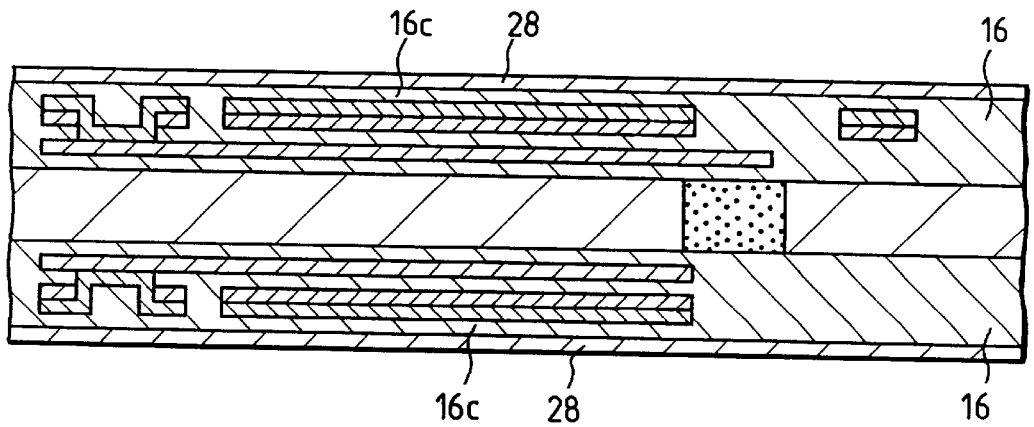
Figure 2C:
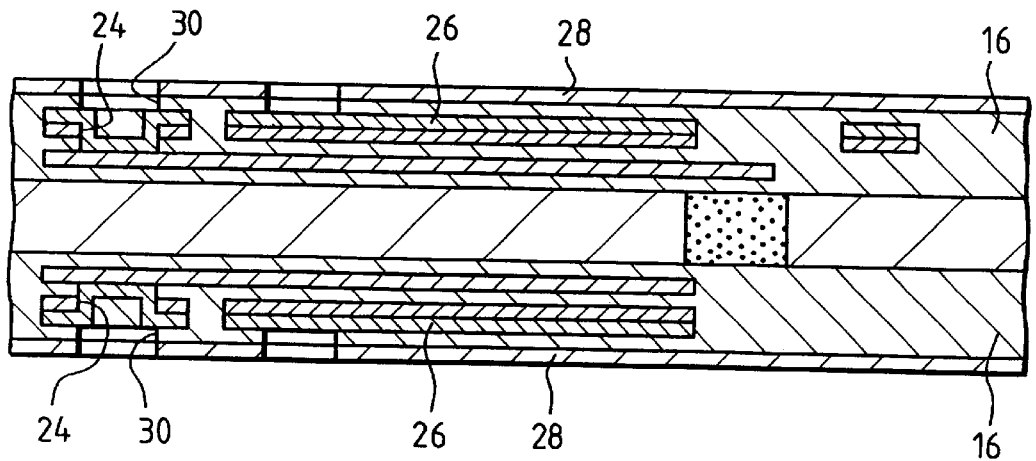
Figure 3A:
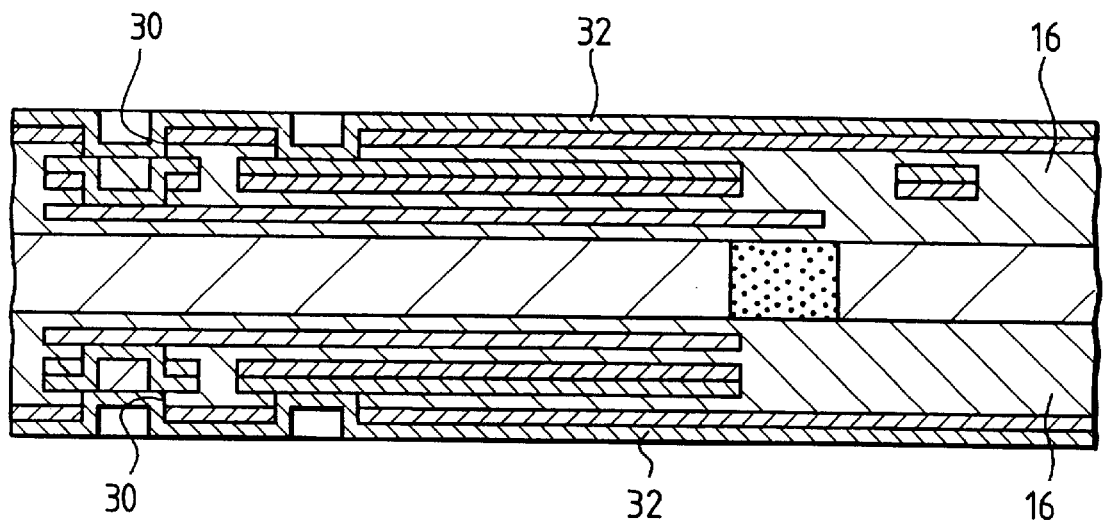
Figure 3B:
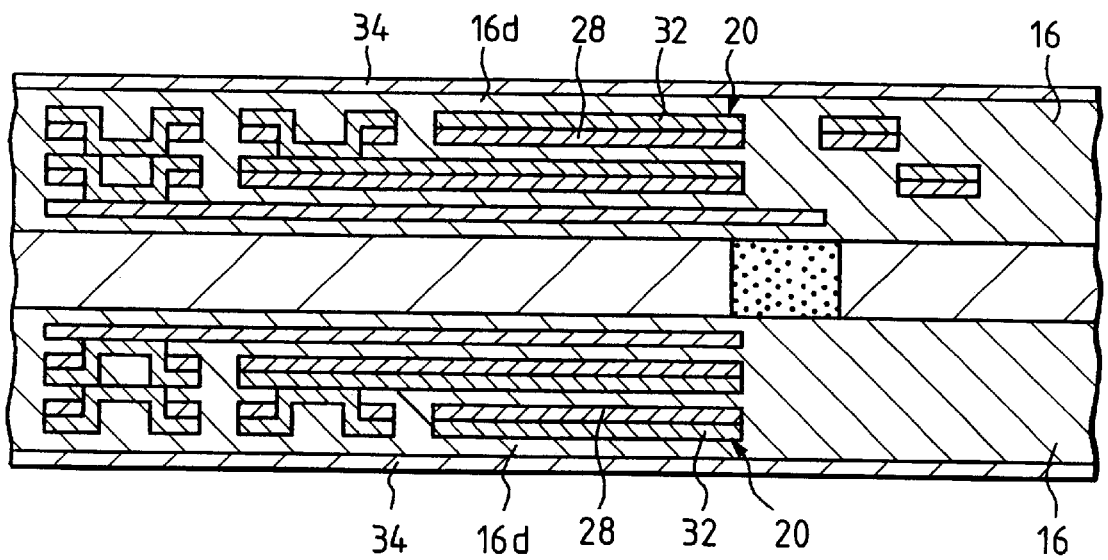
Figure 4A:
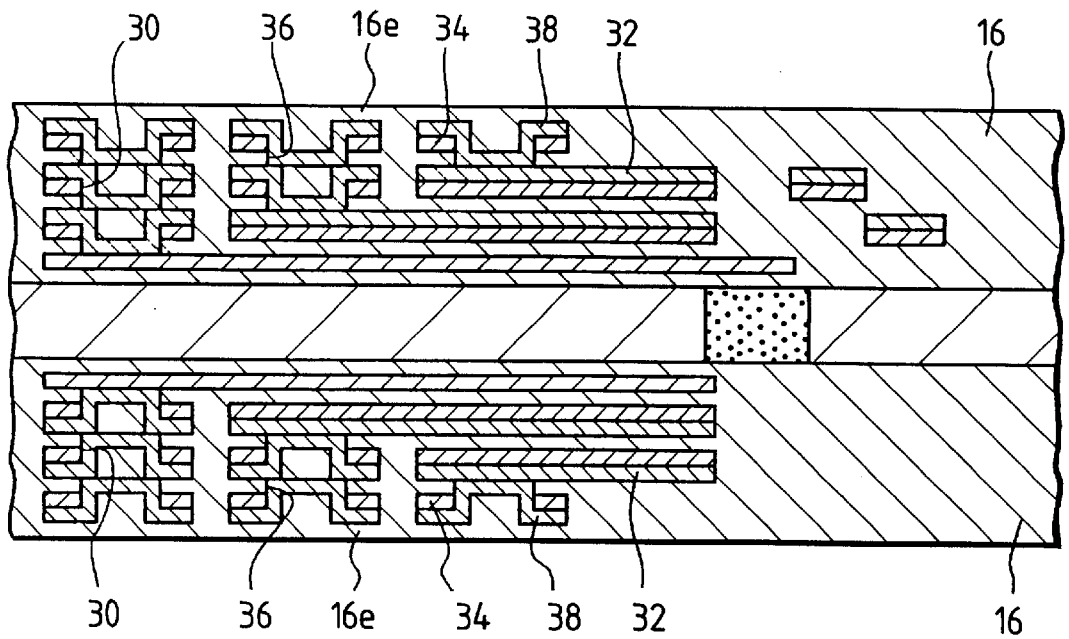
Figure 4B:
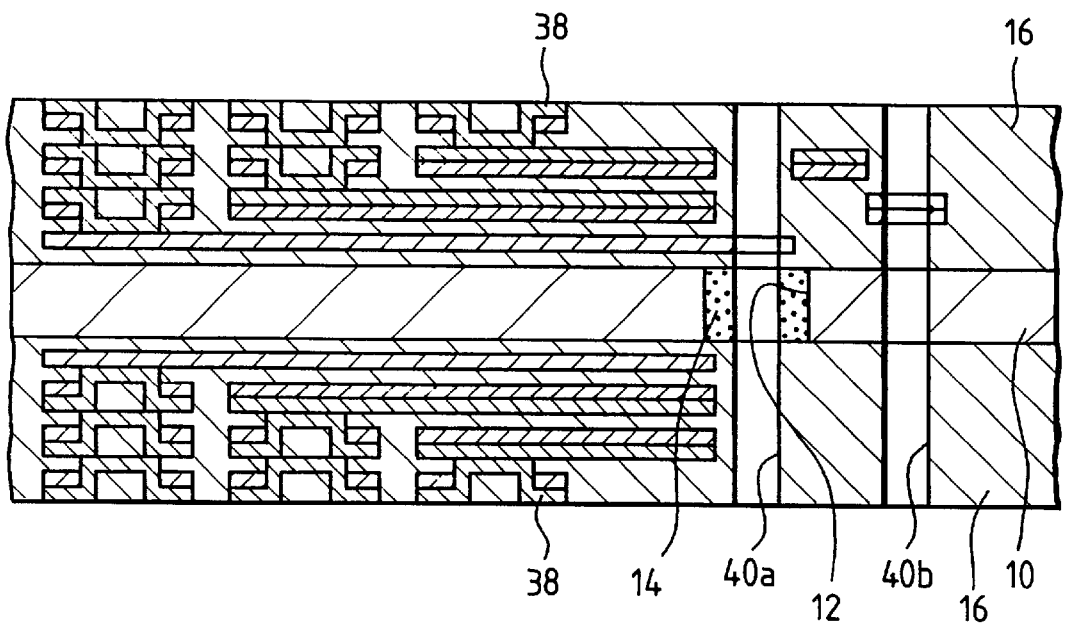
Figure 5:
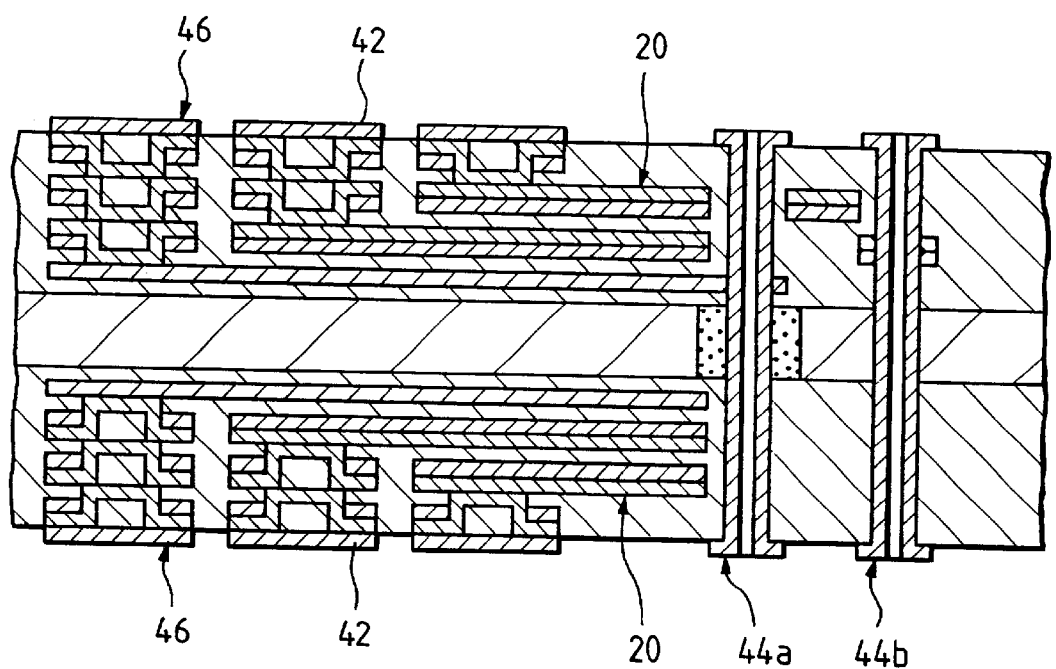

The method for manufacturing a printed circuit board in accordance with the present invention will be described with reference to FIGS. 1 to 5. Firstly as shown in FIG. 1(a), resin holes 12 are opened through copper plate 10, to fill epoxy resin 14 in the resin holes 12 As shown in FIG. 1(b), then, first copper foils 18 are attached through polyimide resins 16a dissolved in solvents on both the faces of the copper plate 10, namely the upper and lower faces of the copper plate 10 as shown in FIG. 1. As shown in FIG. 1(c), then, copper foils 18 are selectively etched to form circuit layers 20, while second copper foils 22 are attached through polyimide resins 16b dissolved in solvents on both the faces, namely the upper and lower faces as shown in FIG. 1. In this case, the polyimide resins 16a and 16b integrally work as polyimide resin layer 16. As shown in FIG. 1(d), subsequently, the copper foils 22 are selectively wet-etched, to irradiate laser beam over the resulting thereby exposed polyimide resin layers 16 to open first connection holes 24 through the copper foils 22 and the polyimide resin layers 16, thereby exposing a part of the copper foils 18. As shown in FIG. 2(a), further, electroless copper plating and electrolytic copper plating are carried out to form first copper-plated layers 26 on both the faces. In this case, copper-plated layer 26 is also formed on the inner face of the connection holes 24. Circuit layers 20 are formed by subsequently etching the copper foils 22 and the copper-plated layers 26 in a selective manner. As shown in FIG. 2(b), then third copper foils 28 are attached through polyimide resins 16c dissolved in solvents on both the faces. In this case, the polyimide resins 16c are integrated with the polyimide resin layers 16. As shown in FIG. 2 (c), further, the copper foils 28 are selectively wet-etched, for irradiation of laser beam over the resulting thereby exposed polyimide resin layers 16, to open second connection holes 30 through the copper foils 28 and the polyimide resin layers 16, thereby exposing a part of the copper-plated layers 26. In this case, the polyimide resins in the connection holes 24 are left as it is. As shown in FIG. 3(a), further, electroless copper plating and electrolytic copper plating are carried out to form second copper-plated layers 32 on both the faces. In this case, copper-plated layers 32 are also formed on the inner faces of the connection holes 30. As shown in FIG. 3(b), then the copper foils 28 and the copper-plated layers 32 are selectively etched, to form circuit layers 20, and on both the faces, fourth copper foils 34 are attached through polyimide resins 16d dissolved in solvents. In this case, the polyimide resins 16d are integrated with the polyimide resin layers 16. As shown in FIG. 4(a), then, the copper foils 34 are selectively wet-etched to expose the polyimide resin layers 16, followed by irradiation of laser beam over the resulting thereby exposed polyimide resin layers 16, to open third connection holes 36 through the copper foils 34 and the polyimide resin layers 16, thereby exposing a part of the copper-plated layers 32. In this case, the polyimide resins in the connection holes 30 are left as it is. By carrying out electroless copper plating and then electrolytic copper plating, subsequently, third copper-plated layers 38 are formed on both the faces thereof. In this case, the copper-plated layers 38 are also formed on the inner faces of the connection holes 36. Then, the copper foils 34 and the copper-plated layers 38 are selectively etched, subsequently, polyimide resins 16e dissolved in solvents are coated on both the faces. Then, the polyimide resins 16e are integrated with the polyimide resin layers 16. As shown in FIG. 4(b), then, the surface portions of polyimide resin layers 16 are removed by plasma etching, thereby exposing the copper-plated layers 38, and then, through-hole openings 40a with the center line approximately lying on the center line of the resin holes 12 are opened through the epoxy resins 14 filled in the resin holes 12 of the copper plate 10 and the polyimide resin layers 16, while through-hole openings 40b are opened through the copper plate 10 and the polyimide resin layers 16. As shown in FIG. 5, then, electroless copper plating and subsequent electrolytic copper plating are carried out to form fourth copper-plated layer 42 on both the faces and the inner faces of the through-hole openings 40a and 40b, and by selectively etching the copper-plated layer 42, through holes 44a and 44b and connection pad 46 are formed.

According to the method for manufacturing a printed circuit board, no warpage occurs therein owing to the absence of any interface in the polyimide resin layer 16 as the insulating layer. The circuit layers 20 formed on both the faces of the copper plate 10 are connected together through the through holes 44a, while the copper plate 10 can be conducted to the circuit layers 20 through the through holes 44b. The connection pad 46 and the circuit layers 20 can be connected together, through the copper-plated layer 38, the copper foil 34, the copper-plated layer 32, the copper foil 28, the copper-plated layer 26 and the copper foil 22.

In the aforementioned embodiment, description is made of a case in which the metal plate is copper plate 10, but other metal plates can be used satisfactorily. In the above embodiment, additionally, description is made of a case in which the first resin is a polyimide resin, but other resins can be used as the first resin, satisfactorily. In the above embodiment, additionally, description is made of a case in which the second resin is epoxy resin 14, but other resins can be used as the first resin satisfactorily. In the above embodiment, additionally, description is made of a case in which the metal foil are copper foils 18, 22, 28, 34, but other metal foils can be used as the metal foil, satisfactorily. In the above embodiment, additionally, description is made of a case in which the plated layer are copper-plated layers 26, 32, 38, 42, but other plated layers can be used, satisfactorily. In the above embodiment, additionally, description is made of a case in which connection holes 24, 30, 36 are opened by laser beam irradiation over the exposed polyimide resin layer 16, but the connection holes 24, 30, 36 can be opened satisfactorily by plasma etching of the exposed polyimide resin layer 16. In the above embodiment, the surface portion of polyimide resin layer 16 is removed by plasma etching to expose the copper-plated layer 38, but the copper-plated layer 38 can be exposed by removing the surface portion of polyimide resin layer 16 through laser beam irradiation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a printed circuit board, comprising:
    forming first resin layers of a solvated first resin on each of two faces of a metal plate, the first and second resin layers forming a continuous first resin matrix on each of the faces of the metal plate;
    attaching and selectively etching first metal foils on the first resin layers;
    forming second resin layers of the solvated first resin on the first metal foils and the first resin layers;
    attaching second metal foils on the second resin layers and opening a first connection holes in the second metal foils and, the second resin layers;
    forming first plated layers on the second metal foils and in the first connection holes; and
    selectively etching the second metal foils and the first plated layers.

2. The method of manufacturing a printed circuit board according to claim 1, further comprising:
    forming third resin layers on the first plated layers and the second resin layers;
    attaching third metal foils on the first plated layers and the third resin layers;
    opening second connection holes in the third metal foils and the third resin layers;
    forming second plated layers on the third metal foils and in the second connection holes; and
    selectively etching the third metal foils and the second plated layers.

3. The method of manufacturing a printed circuit board according to claim 2, further comprising:
    forming fourth resin layers on the second plated layers and the third resin layers;
    attaching fourth metal foils on the fourth resin layers;
    opening third connection holes in the fourth metal foils and the fourth resin layers;
    forming third plated layers on the fourth metal foils and in the third connection holes; and
    selectively etching the fourth metal foils and the third plated layers.

4. The method of manufacturing a printed circuit board according to claim 3, further comprising opening resin holes in the metal plate and filling a second resin in the resin holes.

5. The method of manufacturing a printed circuit board according to claim 1, wherein a copper plate is used as the metal plate.

6. The method of manufacturing a printed circuit board according to claim 1, wherein a polyimide resin is used as the first resin.

7. The method of manufacturing a printed circuit board according to claim 4, wherein an epoxy resin is used as the second resin.

8. The method of manufacturing a printed circuit board according to claim 1, wherein copper foils are used as the first metal foils.

9. The method of manufacturing a printed circuit board according to claim 1, wherein copper-plated layers are used as the first plated layers.

10. The method of manufacturing a printed circuit board according to claim 1, wherein attaching second metal foils comprises:
    selectively etching second metal foils; and
    irradiating a laser beam over resulting exposed second resin layers to open said first connection holes.

11. The method for manufacturing a printed circuit board according to claim 1, wherein opening first connection holes comprises:
    selectively etching said second metal foils; and
    plasma etching resulting exposed additional resin to open said first connection holes.

12. A method of manufacturing a circuit board comprising:
   forming first resin layers on both faces of a metal plate, the first and second resin layers form a continuous first resin matrix on each of the faces of the metal plate;
   forming first metal foil layers on the first resin layers;
   selectively etching the first metal foil layers;
   forming second resin layers on the etched first metal foil layers and the first resin layers;
   forming second metal foil layers on the second resin layers;
   opening first connection holes through the second metal foil layers and the second resin layers to the first metal foil layers;
   forming first plated layers on the second metal foil layers and in the first connection holes; and
   selectively etching the first plated layers and the second metal foil layers.

13. The method of manufacturing a circuit board of claim 12, further comprising:
   forming third resin layers on the etched first plated layers, the etched second metal foil layers and the second resin layers;
   forming third metal foil layers on the third resin layers;
   opening second connection holes through the third metal foil layers and the third resin layers;
   forming second plated layers on the third metal foil layers and in the second connection holes; and
   selectively etching the second plated layers and the third metal foil layers.

14. The method of manufacturing a circuit board of claim 13, further comprising:
   forming fourth resin layers on the etched second plated layers, the etched third metal foil layers and the third resin layers;
   forming fourth metal foil layers on the fourth resin layer;
   opening third connection holes through the fourth metal foil layers and the fourth resin layers;
   forming third plated layers on the fourth metal foil layers and in the third connection holes; and
   selectively etching the third plated layers and the fourth metal foil layers.

15. The method of manufacturing a circuit board of claim 14, wherein resin holes are formed in the metal plate and are filled with a resin, prior to said step of forming first resin layers, the method of manufacturing further comprising:
   opening through holes in the circuit board, the through-holes having respective center lines aligned with respective center lines of the resin holes; and
   forming fourth plated layers on inner faces of the through-holes.

16. The method of manufacturing a circuit board of claim 14, wherein the first through fourth resin layers are a polyimide resin dissolved in solvents on respective under-layers of the circuit board.

17. The method of manufacturing a circuit board of claim 12, wherein said step of opening comprises:
   selectively etching the second metal foil layers to expose the second resin layers; and
   irradiating a laser beam on the exposed second resin layers to form the first connection holes.

18. The method of manufacturing a circuit board of claim 12, wherein said step of opening comprises:
   selectively etching the second metal foil layers to expose the second resin layers; and
   plasma etching the exposed second resin layers to form the first connection holes.

19. The method of manufacturing a circuit board of claim 12, wherein the metal plate is a copper plate.

20. The method of manufacturing a circuit board of claim 12, wherein the first metal foil layers are copper foil attached to the first resin layers.

21. The method of manufacturing a printed circuit board according to claim 4, further comprising:
   opening through-hole openings having respective center lines approximately lying on respective center lines of the resin holes; and
   forming fourth plated layers on inner faces of said through-hole openings.

22. The method for manufacturing a printed circuit board according to claim 12, wherein the first metal foil layers are formed directly on the first resin layers.

* * * * *